(12) United States Patent
Donze et al.

(10) Patent No.: US 7,241,649 B2
(45) Date of Patent: Jul. 10, 2007

(54) FINFET BODY CONTACT STRUCTURE

(75) Inventors: Richard Lee Donze, Rochester, MN (US); Karl Robert Erickson, Rochester, MN (US); William Paul Hovis, Rochester, MN (US); Terrance Wayne Kueper, Rochester, MN (US); John Edward Sheets, II, Zumbrota, MN (US); Jon Robert Tetzloff, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 200 days.

(21) Appl. No.: 10/977,768

(22) Filed: Oct. 29, 2004

(65) Prior Publication Data

US 2006/0091463 A1    May 4, 2006

(51) Int. Cl.
   *H01L 21/84* (2006.01)

(52) U.S. Cl. ............... 438/156; 438/157; 438/164; 257/329; 257/E29.262; 257/E21.41

(58) Field of Classification Search .......... 438/156, 438/157, 164; 257/329, 365, E21.41, E29.262
See application file for complete search history.

(56) References Cited

U.S. PATENT DOCUMENTS

| | | | | |
|---|---|---|---|---|
| 5,072,266 | A | * | 12/1991 | Bulucea et al. ............ 257/330 |
| 6,413,802 | B1 | * | 7/2002 | Hu et al. .................... 438/151 |
| 7,005,330 | B2 | * | 2/2006 | Yeo et al. ................... 438/157 |
| 2002/0137298 | A1 | * | 9/2002 | Ohguro ...................... 438/365 |
| 2004/0036121 | A1 | * | 2/2004 | Aoki et al. ................. 257/365 |

* cited by examiner

*Primary Examiner*—B. William Baumeister
*Assistant Examiner*—Steven J. Fulk
(74) *Attorney, Agent, or Firm*—Robert R. Williams

(57) ABSTRACT

A FinFET body contact structure and a method for creating the FinFET body contact structure are disclosed. The body contact structure comprises a wide fin portion of a semiconductor fin, the wide fin portion having a polysilicon polygon shape formed on a top surface of the wide fin portion. The polysilicon polygon shape has a center area having no polysilicon. FinFETs are formed on two vertical surfaces of the wide fin portion and gates of the FinFETs are coupled to the polysilicon polygon shape. Top surfaces of the wide fin portion and the polysilicon polygon shape are silicided. Silicide bridging is prevented by sidewall spacers. All convex angles on the polysilicon polygon shape are obtuse enough to prevent creation of bridging vertices. The center area is doped of an opposite type from a source and a drain of an associated FinFET.

14 Claims, 12 Drawing Sheets

FINFET BODY CONTACT STRUCTURE

BACKGROUND OF THE INVENTION

1. Field of the Invention

The current invention generally relates to semiconductor products. More specifically, the present invention relates to making body contacts on FinFETs.

2. Description of the Related Art

Field Effect Transistors (FETs) have been the dominant semiconductor technology used to make Application Specific Integrated Circuit (ASIC) chips, microprocessor chips, Static Random Access Memory (SRAM) chips, and the like for many years. In particular, Complementary Metal Oxide Semiconductor (CMOS) technology has dominated the semiconductor process industry for a number of years.

Technology advances have scaled FETs on semiconductor chips to increasingly small dimensions, allowing power per logic gate to be dramatically reduced, and further allowing a very large number of FETs to be fabricated on a single semiconductor chip. Scaling of FETs is currently running into physical limits. Gate oxides have become thin enough that leakage occurs through the gate oxides. Further scaling of gate oxide thickness will bring an exponential increase in leakage. Power dissipated by leakage currents has become a significant portion of total chip power, and an exponential increase in leakage results in unacceptable power dissipation for many types of chips.

Silicon on Insulator (SOI) processes have reduced FET source and drain capacitances, resulting in an improved power/performance ratio for CMOS chips fabricated in an SOI process. However, conventional SOI processes are reaching fundamental limits, resulting in undesirable effects such as the leakage effects mentioned above. Therefore, innovative new ways to make CMOS devices are being created. A FinFET is a recently developed FET device that utilizes 3-D (three dimensional) techniques to pack a large number of FETs in a given area of a semiconductor chip while reducing some of the problems described above.

Prior art FIG. 1 shows an isometric view of a FinFET. A tall, thin semiconductor fin 2 of semiconductor material (typically silicon) suitable for doping as source and drain regions rises from an insulator 1. Polysilicon gate 5 is a polysilicon conductor that surrounds fin 2 on three sides in FIG. 1. In regions where the silicon material is doped P−, source 3 and drain 4 are subsequently doped to become N+ regions, with the P− region under gate 5 serving as a body (not shown in FIG. 1) of the FinFET. A thin gate oxide 6 separates polysilicon gate 5 from the body. FinFETs have significant advantages, being "three dimensional" FETs, the gate can induce conducting channels on three sides, increasing current flow through a conducting FET, and making it less necessary that the gate oxide 6 be as thin as the gate oxide of a conventional planar FET.

FIG. 2A is a prior art drawing showing a top view (i.e., looking "down" towards insulator 1) of a FinFET. Source 3 and drain 4 are doped N+ (for an N-channel FET, an NFET). To better illustrate the makeup of the FinFET, a cross sectional view at AA is shown in FIG. 2B, also prior art. A body 8 is the portion of fin 2 that is the body of the FinFET, and is P− for the NFET. (A P-channel FET (PFET) would begin with an N− doped fin, the source and drain regions of the PFET subsequently doped P+.) The thin gate oxide 6 is shown covering both sides and the top of body 8. Polysilicon gate 5 is the gate of the FinFET and surrounds body 8 on both vertical sides and the top, separated from body 8 by thin gate oxide 6. When polysilicon gate 5 turns on the FinFET (e.g., is a high voltage relative to source 3 for an NFET), carriers conduct from source 3 to drain 4 in a direction into (or out of) the page, in FIG. 2B, in portions of body 8 near thin oxide 6.

One will note in FIG. 2B that body 8 is totally surrounded by insulating material. Insulator 1 is at the bottom of body 8; thin gate oxide 6 surrounds the left, right, and top sides of body 8. Therefore, no electrical connection to body 8 can be made to control a voltage on body 8, other than the P−/N+ junctions (for an NFET) between body 8 and source 3 and drain 4. The body voltage, relative to a voltage on the source of the FET, tends to "float". For example, when the FET is "off", and source to drain voltage is relatively high, junction leakage from the drain charges the body. However, if the body voltage becomes more than a diode drop difference from the source voltage, the body/source junction will begin to forward bias, clamping the body voltage to be no more than a diode drop different than the source voltage. (For silicon, diode drops are approximately 0.7 volts). Actual body voltage relative to the source depends on a number of factors, including temperature and switching history of the FET. A threshold voltage of a FET is dependent in part on a voltage difference between the source and the body. Many digital applications (e.g., NAND gates, NOR gates, latches, and the like) are not greatly affected by threshold uncertainty caused by variation of body to source voltage variation that can occur. For example, small delay uncertainties may occur that are acceptable, and accounted for in delay calculations. However, a number of circuits rely on a known source to body voltage for proper operation. Examples of such circuits that rely on a known source to body voltage for proper operation include, but are not limited to, differential receivers, operational amplifiers, and the like. Such circuits that rely on known source to body voltages require that the body be tied to a voltage. Often, NFET bodies are coupled to ground; PFET bodies are tied to a positive supply often referred to as Vdd. Often, FETs, used in a differential stage having gates coupled to a true and a complement signal, have bodies coupled together.

Therefore, there is a need for a method and apparatus that create a FinFET body contact so that the FinFET body can be coupled to a voltage supply, or to other FinFET bodies.

SUMMARY OF THE INVENTION

The current invention teaches a structure and method for making a body contact to a body of a FinFET. The body contact can be used to couple a body of a FinFET to a voltage supply (e.g., ground, a positive voltage supply or a negative voltage supply). The body contact can be used to couple a body of a first FinFET to a body of a second FinFET.

An embodiment of the present invention provides a structure that allows the body of a FinFET to be coupled to a body contact through an electrical path of semiconductor material wider than the polysilicon shape forming the channel length of the FinFET.

In an embodiment of the invention, a FinFET comprises a semiconductor fin formed on an insulator. The semiconductor fin has a wide fin portion. A polysilicon polygon shape having a center area without polysilicon is formed on a top surface of the wide fin portion. It will be understood that the entire fin may be the width of the wide fin portion, or even wider. The wide fin portion must be wide enough to form the polysilicon polygon shape on the top surface of the wide fin portion. The polysilicon polygon shape is separated from the silicon on the top surface of the wide fin portion by a thin oxide layer. The polysilicon polygon shape has three or more sides on an outer perimeter. Angles on the outer periphery and the inner periphery of the polygon shape contain no bridging vertices that would cause a silicide bridge to form between the polysilicon of the polysilicon polygon shape and the silicon on the top surface of the wide fin portion. A first polysilicon shape is formed on a first vertical surface of the wide fin portion, and a second polysilicon shape is formed on a second vertical surface of the wide fin portion. The first and second polysilicon shapes are separated from the silicon of the first and second vertical surfaces of the wide fin portion by a thin oxide layer. The first and second polysilicon shapes are coupled to polysilicon polygon shape. The semiconductor in the wide fin portion under the center area of the polysilicon polygon shape is a first type of semiconductor material (e.g., P or N). Areas on the fin covered by polysilicon are of the same type of semiconductor material, although doping concentration may differ. The remainder of the fin is of a second type of semiconductor material opposite of the first type (e.g., N or P). A first FinFET is formed on the first vertical surface, the first polysilicon shape being the gate of the first FinFET. A second FinFET is formed on the second vertical surface, the second polysilicon shape being the gate of the second FinFET. The first FinFET may include a first horizontal FinFET portion defined by a horizontal extension of the first polysilicon shape coupling the first polysilicon shape to the polysilicon polygon shape. Similarly, the second FinFET may include a second horizontal FinFET portion defined by a horizontal extension of the second polysilicon shape coupling the second polysilicon shape to the polysilicon polygon shape. Polysilicon shapes and silicon shapes on the top surface of the semiconductor fin are silicided to provide a good contact between the polysilicon or silicon and a conductive interconnect material, typically metal, such as copper or aluminum. Polysilicon shapes and silicon shapes on vertical surfaces of the semiconductor fin are not silicided.

DETAILED DESCRIPTION OF THE PREFERRED EMBODIMENTS

The invention will be described in detail with reference to the figures. It will be appreciated that this description and these figures are for illustrative purposes only, and are not intended to limit the scope of the invention. In particular, various descriptions and illustrations of the applicability, use, and advantages of the invention are exemplary only, and do not define the scope of the invention. Accordingly, all questions of scope must be resolved only from claims set forth elsewhere in this disclosure.

The current invention teaches a structure and method for making a body contact to a body of a FinFET. The body contact can be used to couple a body of a FinFET to a voltage supply (e.g., ground, a positive voltage supply or a negative voltage supply). The body contact can be used to couple a body of a first FinFET to a body of a second FinFET.

In modern semiconductor processing a silicide step is used to reduce resistance on polysilicon and silicon shapes, as well as to provide a surface on the polysilicon and silicon shapes that will make a good contact with metal. However, the silicide will make an electrically conducting silicide bridge unless sidewall spacers are used in places where silicide is formed on polysilicon shapes. The following discussion explains how a silicide bridge will form at a bridging vertex.

Figure 1:
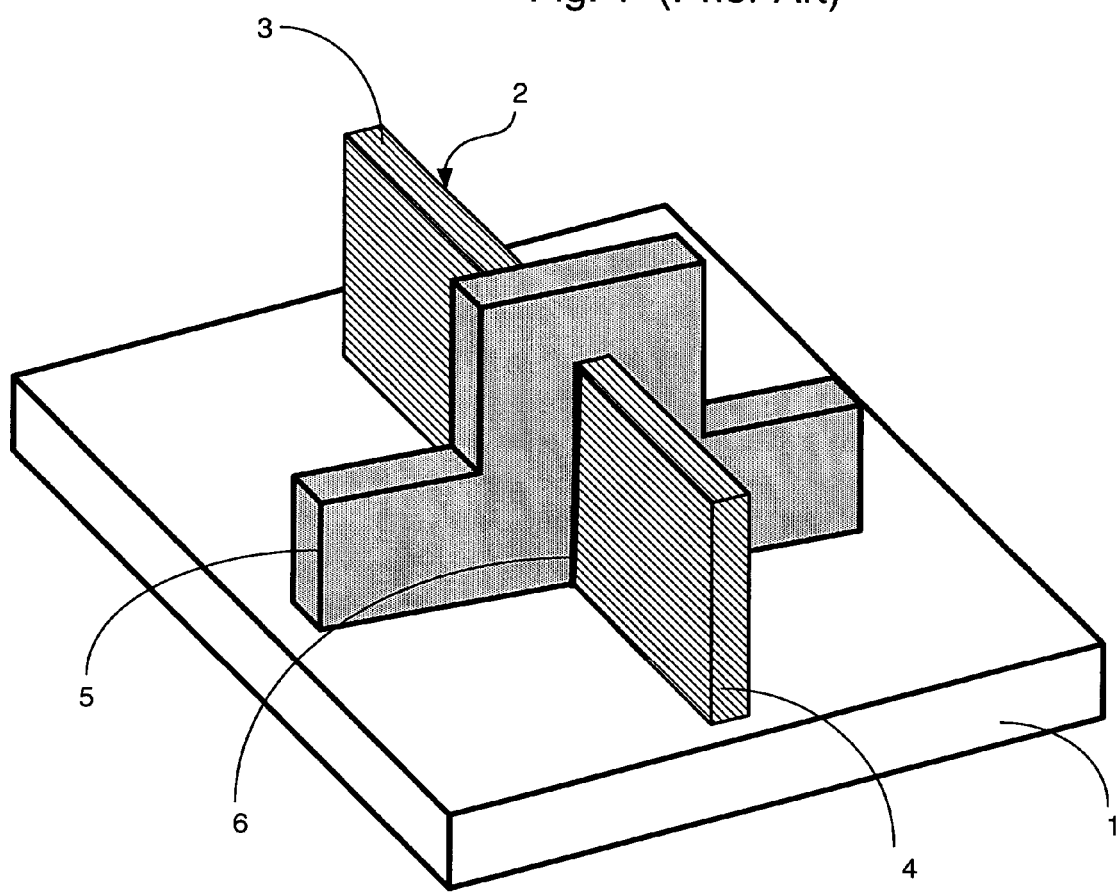
FIG. 1 is a prior art isometric drawing that shows a FinFET.
Figure 2B:
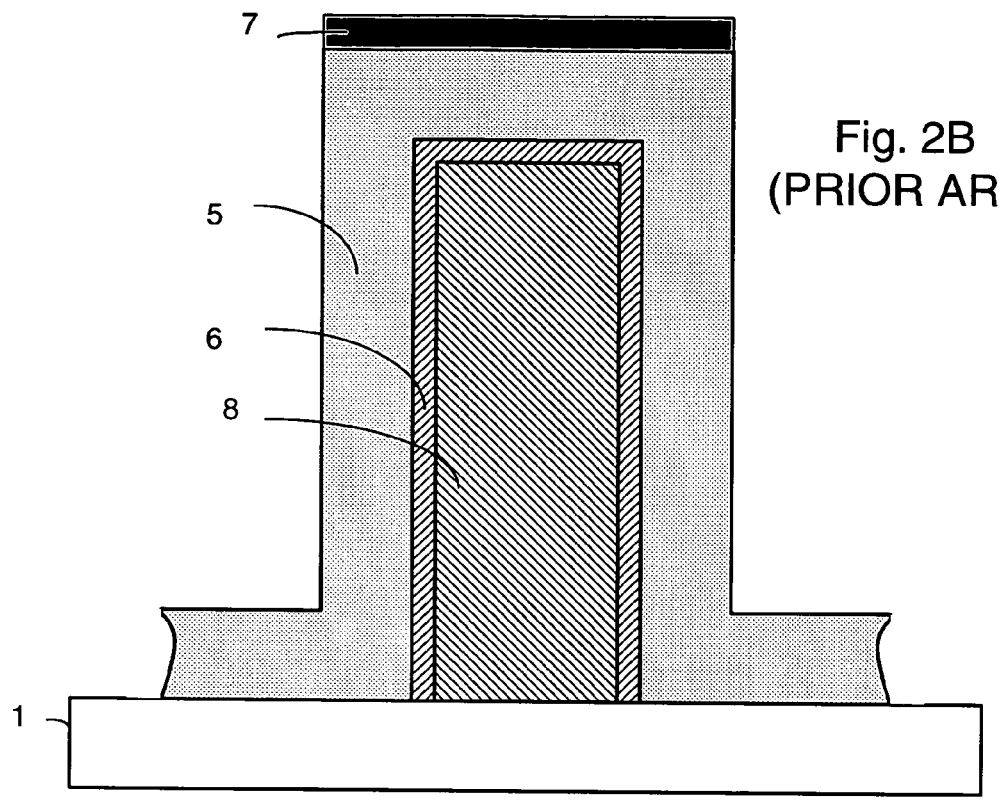
FIG. 2B is a prior art drawing shows a cross sectional view AA of the FinFET of FIG. 2A.
Figure 2A:
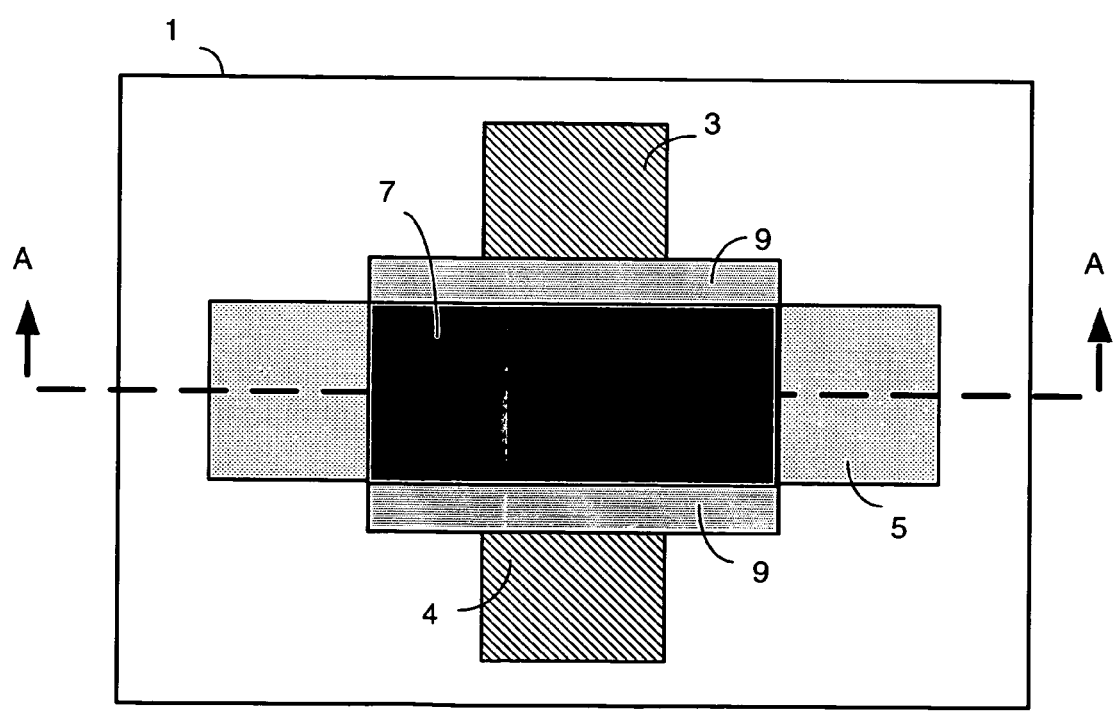
FIG. 2A is a prior art drawing showing a top view of a FinFET and identifies a cross section AA.
Figure 3:
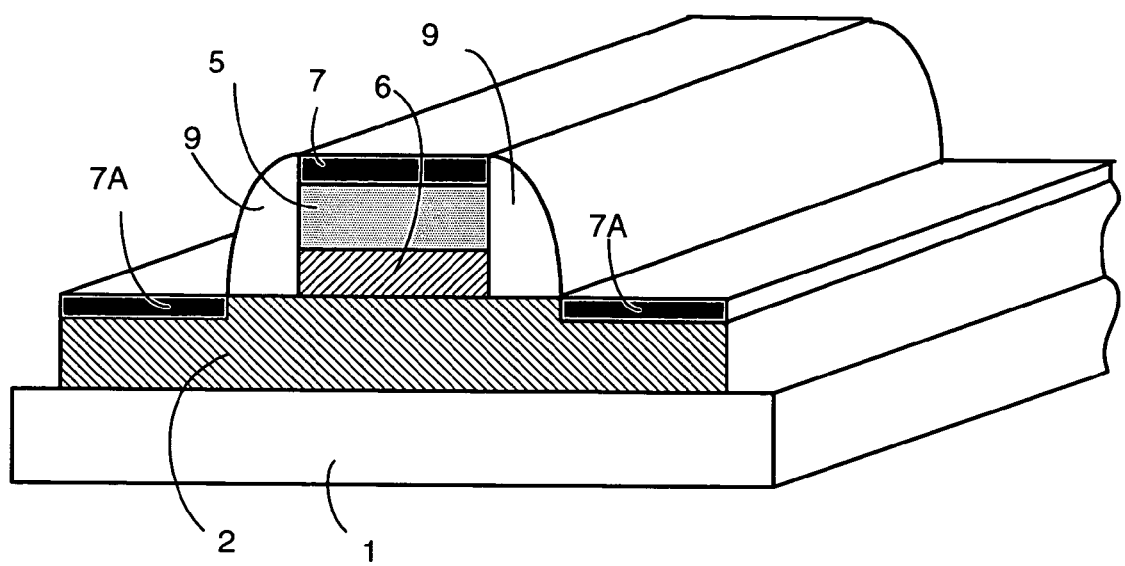
FIG. 3 is a prior art drawing showing a horizontal polysilicon shape over a silicon surface, separated by a thin oxide.

FIG. 3 is a prior art drawing showing an insulator 1 beneath a semiconductor 2. A polysilicon gate 5 is separated from semiconductor 2 by thin oxide 6. Sidewall spacers 9 are formed on vertical surfaces of the gate structure (i.e., thin oxide 6 and polysilicon gate 5), typically by depositing a layer of silicon dioxide and subsequently doing an anisotropic etch leaving sidewall spacers 9 as shown. After formation of sidewall spacers 9, a silicide is formed on exposed surfaces of polysilicon gate 5 and semiconductor 2, leaving silicide areas 7 and 7A, respectively. Sidewall spacers 9 keep vertical surfaces of polysilicon gate 5 from exposure to the silicide process.

Figure 4A:
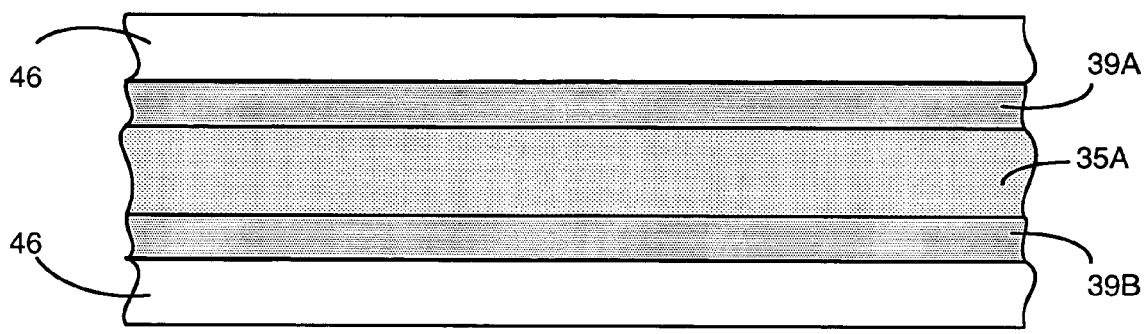
FIGS. 4A–4C show top views of polysilicon shapes formed over a silicon area.

FIG. 4A shows a semiconductor (typically silicon) shape 46 having a polysilicon shape 35A formed thereon, separated by a thin oxide layer (not shown). Side wall spacers 39A, 39B are formed by conventional means comprising formation of an oxide layer over silicon shape 46 and polysilicon shape 35A. An anisotropic etch removes the oxide layer except along the vertical surfaces of polysilicon shape 35A.

Figure 4B:
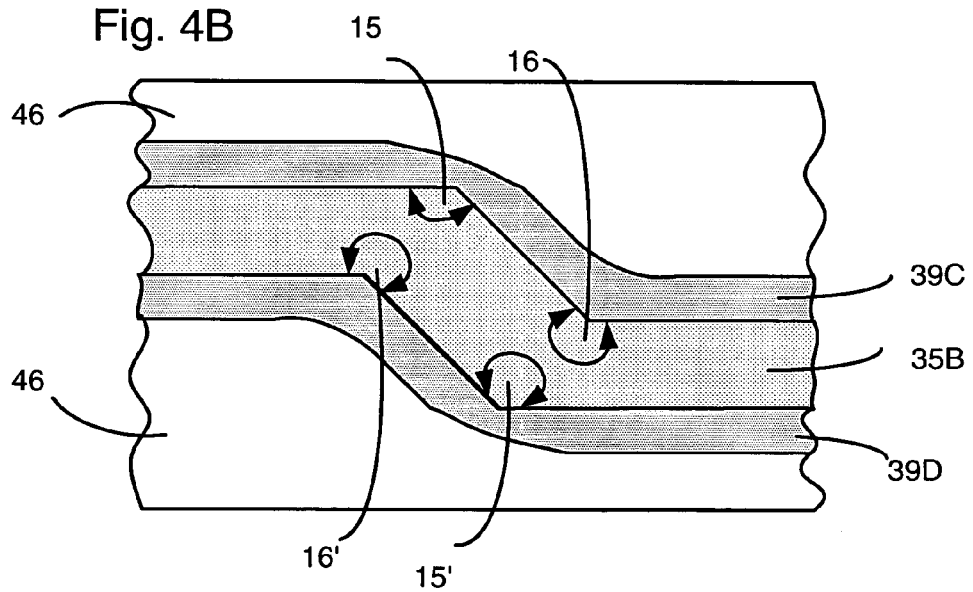

FIG. 4B shows the semiconductor shape 46 having a polysilicon shape 35B formed thereon, separated by a thin oxide layer (not shown). Polysilicon shape 35B has two bends. A first bend is characterized by angles 15 and 16'; a second bend is characterized by angles 16 and 15'. Sidewall spacers 39C, 39D are thinner in the vicinity of convex angles 15 and 15', and thicker in the vicinity of concave angles 16 and 16'. Sidewall spacers tend to thin around convex angles and thicken along concave corners.

Figure 4C:
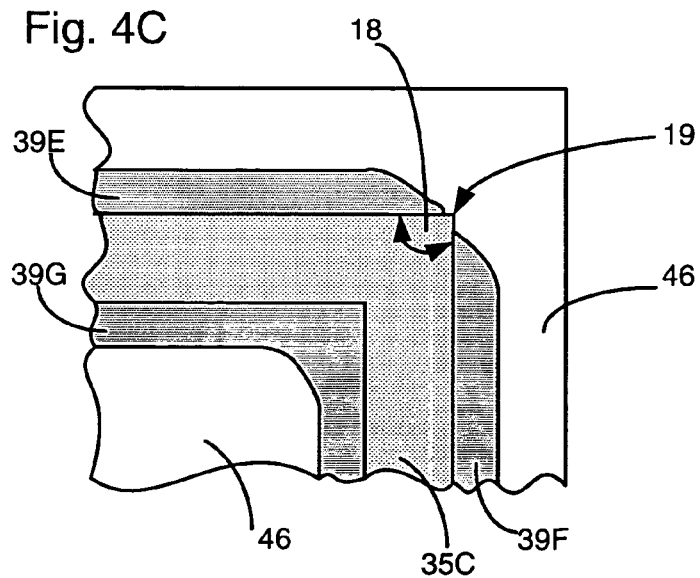

FIG. 4C shows the silicon shape 46 having a polysilicon shape 35C formed thereon, separated by a thin oxide layer (not shown). Polysilicon shape 35C has a 90 degree bend. Sidewall spacer 39G is thicker in the vicinity of the concave portion of the 90 degree bend. The convex portion of the 90 degree bend is shown to have thinned the sidewall spacer to the point of causing an absence of the sidewall spacer in the vicinity of the convex portion of the 90 degree bend, leaving sidewall spacers 39E, 39F to be separated, thereby exposing a vertical surface of the polysilicon shape to the silicide process. A bend in a polysilicon shape that is acute enough (convex enough) to expose a vertical surface of a polysilicon shape is called a bridging vertex. Bridging vertex 19 is pointed to by an arrow.

Figure 5:
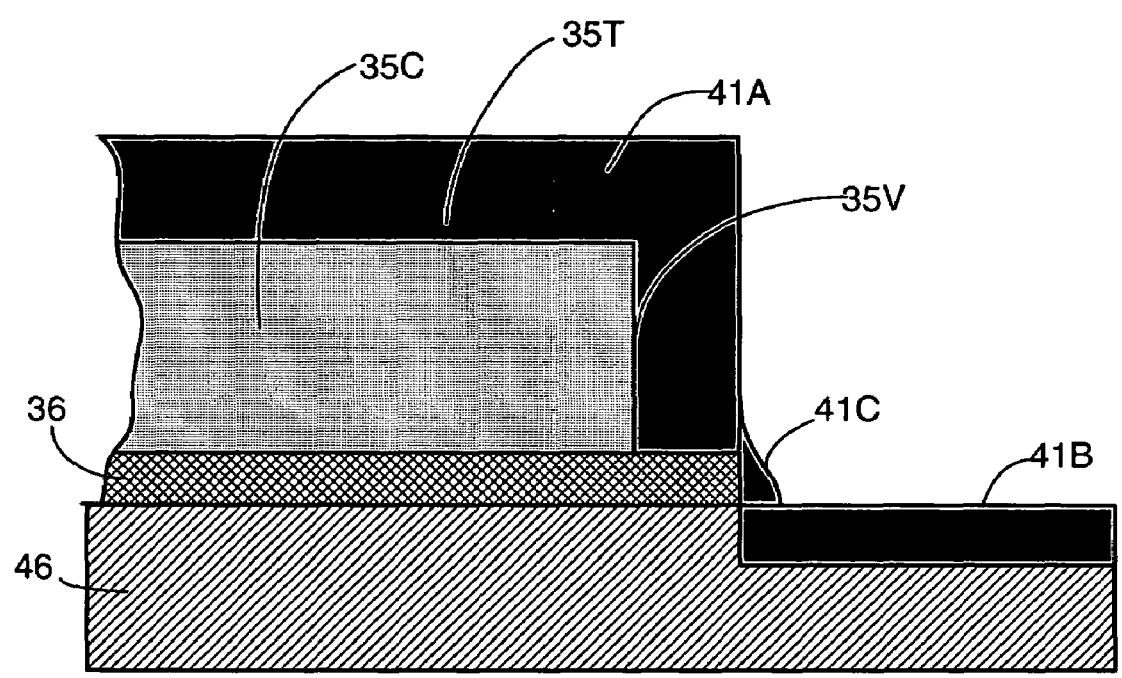
FIG. 5 shows a sectional view of a bridging vertex, illustrating how a silicide bridge forms between a polysilicon shape and a silicon shape over a thin oxide layer.

FIG. 5 illustrates a cross sectional view of bridging vertex 19 of FIG. 4C. Polysilicon shape 35C has a silicide 41A formed thereon on a top surface 35T and on a vertical surface shown as 35V. Vertical surface 35V is exposed to the silicide process by the separation of sidewall spacers 39E and 39F at bridging vertex 19 as previously illustrated in FIG. 4C. Thin oxide 36 is intended to prevent an electrical signal coupled to polysilicon shape 35C from shorting to silicon shape 46. Thin oxide 36 is only several atoms thick in modern semiconductor technology. When vertical surface 35V is exposed to the silicide process, silicide forms on vertical surface 35V. Silicide will also be formed on exposed areas of silicon shape 46, creating silicide shape 41 B. Because thin oxide 36 is very thin, a silicide bridge 41C will form, electrically shorting polysilicon shape 35C to silicon shape 46.

Angles that are subject to creation of bridging vertices depend upon the particular semiconductor process and tolerances within that particular semiconductor process. For example thickness of the thin oxide and design thickness of the sidewall spacer (e.g., thickness of the sidewall spacer on a portion of a polysilicon shape having no bend) are key process parameters that determine how acute a convex angle in a polysilicon shape must be to create a bridging vertex. For example, in a first semiconductor process, a convex angle of 135 degrees will not cause a bridging vertex, but more acute angles would cause a bridging vertex to be formed. A 135 degree angle is the convex angle characteristic of a regular octagon. As a second example, in a second semiconductor process, a convex angle of 120 degrees will not cause a bridging vertex, but more acute angles would cause a bridging vertex to be formed. A 120 degree angle is the convex angle characteristic of a regular hexagon.

Prevention of such silicide bridges requires that all convex angles on a polysilicon shape over a silicon shape be sufficiently obtuse as to not form a bridging vertex on any of the convex angles of the polysilicon shape.

Figure 6A:
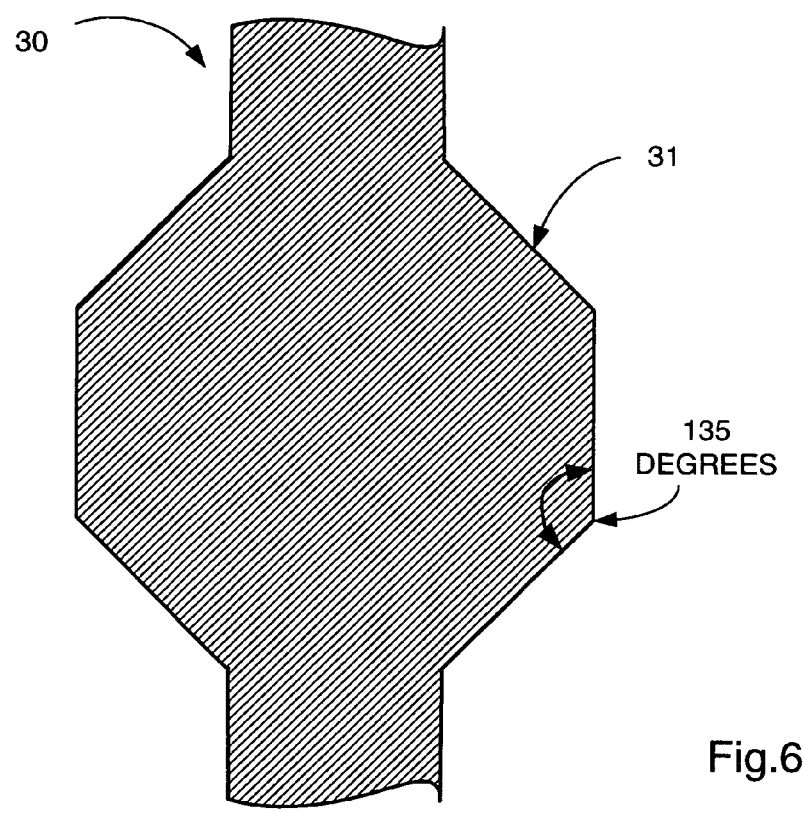
FIG. 6A shows a top view of a semiconductor fin having a wide fin portion.
Figure 6B:
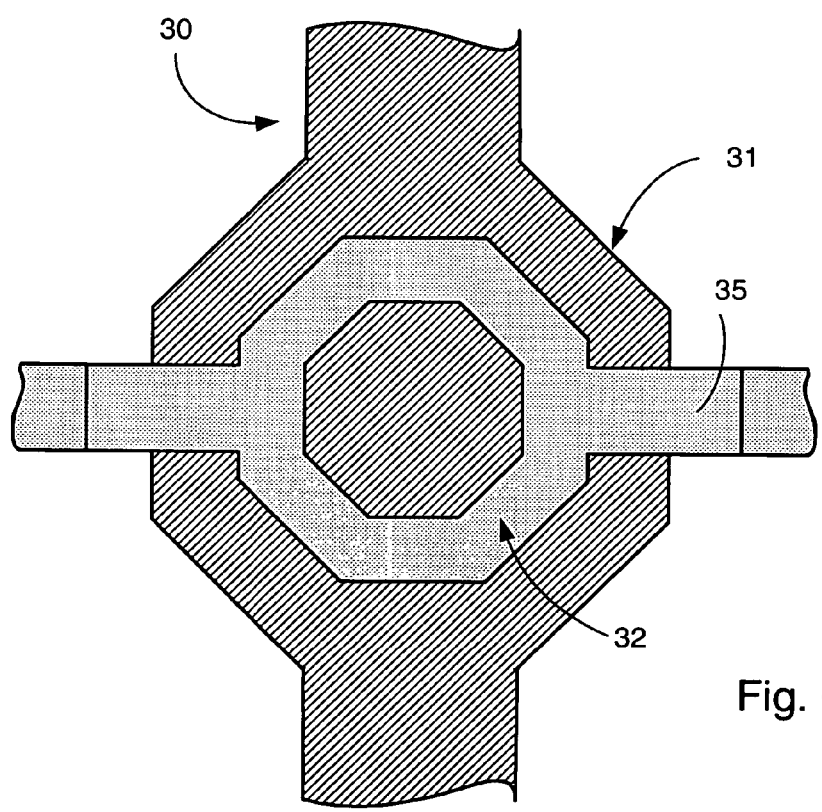
FIG. 6B shows a polygon polysilicon shape having a gap.

FIG. 6A shows a top view of a semiconductor fin 30 having a wide fin portion 31. Wide fin portion 31 is shown to have convex angles of 135 degrees, one of the 135 degree convex angles is shown (e.g., wide fin portion 31 is shown as a regular octagon). However the convex angles of wide fin portion 31 are not critical. FIG. 6B shows semiconductor fin 30 having a polysilicon polygon shape 32 made up of polysilicon 35 formed on the top surface of wide fin portion 31. Polysilicon in polysilicon polygon shape 32 is separated from the top surface of wide fin portion 31 by a layer of thin oxide. It will be understood that portions of semiconductor fin 30 that are not the wide fin portion may be the width of wide fin portion 31, or even wider. The wide fin portion must be wide enough to form polysilicon polygon 32 shape on the top surface of the wide fin portion. To prevent electrical shorting, bridging vertices must be avoided. Polysilicon polygon shape 32 is shown as a regular octagon in FIG. 6B. If a 135 degree convex angle creates a bridging vertex in a first particular semiconductor process, more sides in polysilicon polygon shape 32 are required, such that the convex angles of the polysilicon polygon shape 32 do not form a bridging vertex. Similarly, if a second particular semiconductor process does not create a bridging vertex on a 90 degree angle, then polysilicon polygon shape 32 can be made a square (or a rectangle) for the second particular semiconductor process.

Polysilicon polygon shape 32 is shown to have a center area where no polysilicon 35 exists. Typically, polysilicon is deposited over an entire semiconductor chip (during processing of the semiconductor chip, and polysilicon is then removed from areas where polysilicon is not desired. As shown, all interior angles are concave angles which will not form bridging vertices. Although the center area is shown having the same angles at corners as angles on the outer portions of the polysilicon polygon shape (i.e., shown as concentric polygons), the present invention contemplates any suitable concave angles for the inner portion of polysilicon polygon shape 32.

Figure 6C:
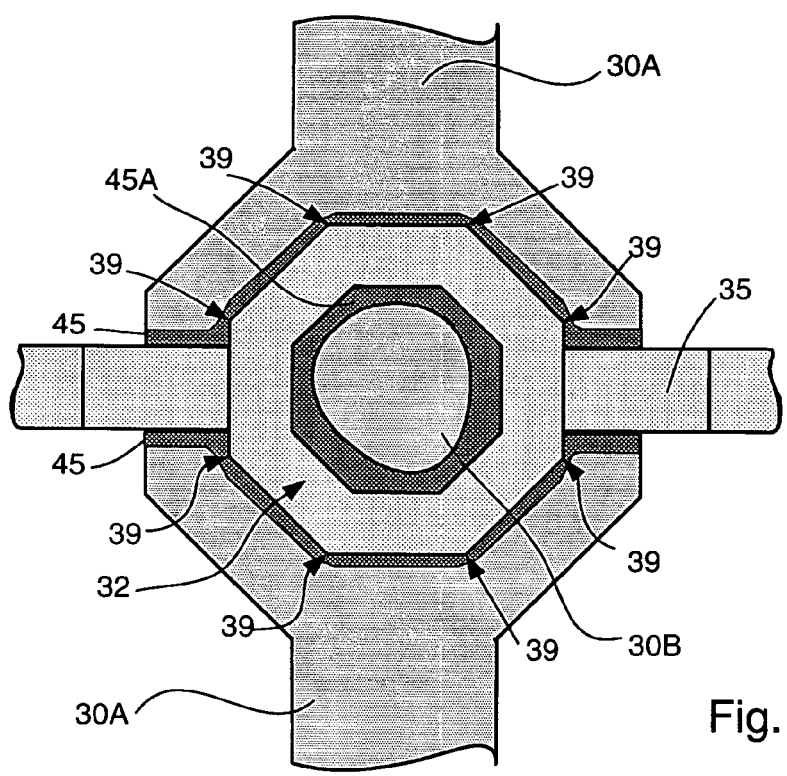
FIG. 6C shows the structure of FIG. 6B, but further includes a sidewall spacer.

FIG. 6C shows the structure of FIG. 6B after processing steps in which portions of semiconductor fin 30 are doped to become doped semiconductor area 30A. Doped semiconductor area 30A is N+ doped semiconductor, for an NFET; P+ doped semiconductor for a PFET. The center area is doped (or left with the original doping of semiconductor fin 30 to become doped semiconductor area 30B (which may be doped P+ for an NFET, or, alternatively, allowed to remain P– (for an NFET; N– for a PFET). Sidewall spacers 45 and 45A are formed. Areas 39 show that sidewall spacers 45 become thinner at the convex angles of polysilicon polygon shape 32, but have not thinned enough to form bridging vertices at areas 39. The center area of polysilicon polygon shape 32 only has concave angles; a sidewall spacer 45A is shown to thicken at such concave angles. Sidewall spacers tend to thicken at concave angles, as explained earlier.

Figure 6D:
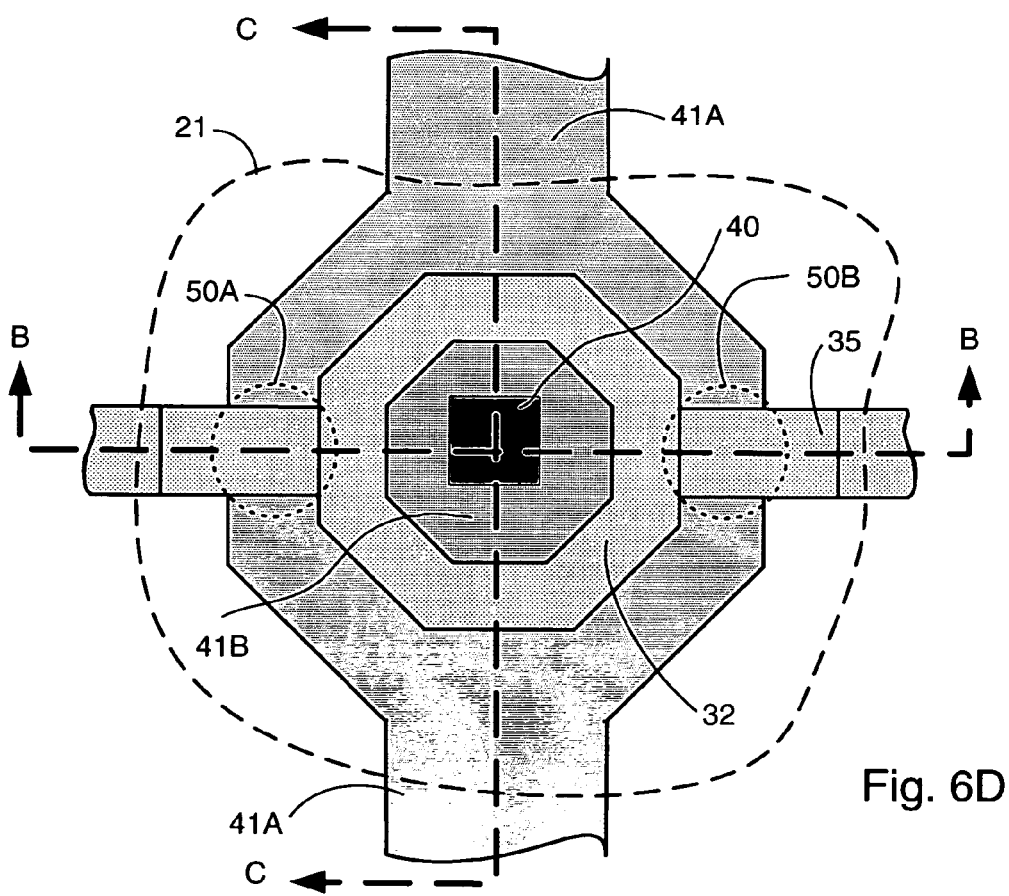
FIG. 6D shows the structure of FIG. 6C, omitting the sidewall spacer for simplicity.

FIG. 6D shows the structure of FIG. 6C with additional detail and identification of cross sectional views. Exposed areas of polysilicon shape 35 and fin 30 (i.e., doped silicon areas 30A and 30B in FIG. 6C) are silicided to increase conductivity and to facilitate low-resistance contacts to the top surfaces of those exposed areas. Doped semiconductor area 30A of FIG. 6C has a silicide layer 41A formed thereon; doped semiconductor area 30B of FIG. 6C has a silicide layer 41B formed thereon. A contact 40 is shown on silicide layer 41B. Contact 40 (shown in more detail in FIG. 6E) couples doped semiconductor area 30B to a voltage, or, alternately, to a body of another FinFET, using another conductor, such as metal wiring, on a semiconductor chip upon which the FinFETs are formed. Dotted ovals 50A and 50B show where the bodies of the FinFET occur. For an NFET, doped semiconductor area 30A is now N+. The area in semiconductor fin 30 covered by polysilicon shape 35 (separated from polysilicon shape 35 by a thin oxide as explained earlier) is the body of the FinFET and remains doped P– for an NFET (N– for a PFET). Note that polysilicon shape 35 covers a portion of the leftmost vertical side of wide fin portion 31 and the rightmost vertical side of wide fin portion 31 from the top surface of wide fin portion 31 to the insulator upon which fin 30 is formed, as explained earlier. BB and CC identify cross sectional views that are presented in FIGS. 6E and 6F.

FIG. 6D shows a top view of a FinFET body contact structure 21, comprising wide fin portion 31 (identified in FIG. 6A), polysilicon polygon shape 32, sidewalls 45 and 45A (identified in FIG. 6C), the dopings as described earlier, silicides 41A and 41B, FinFETs 50A, 50B, and contact 40.

Figure 6E:
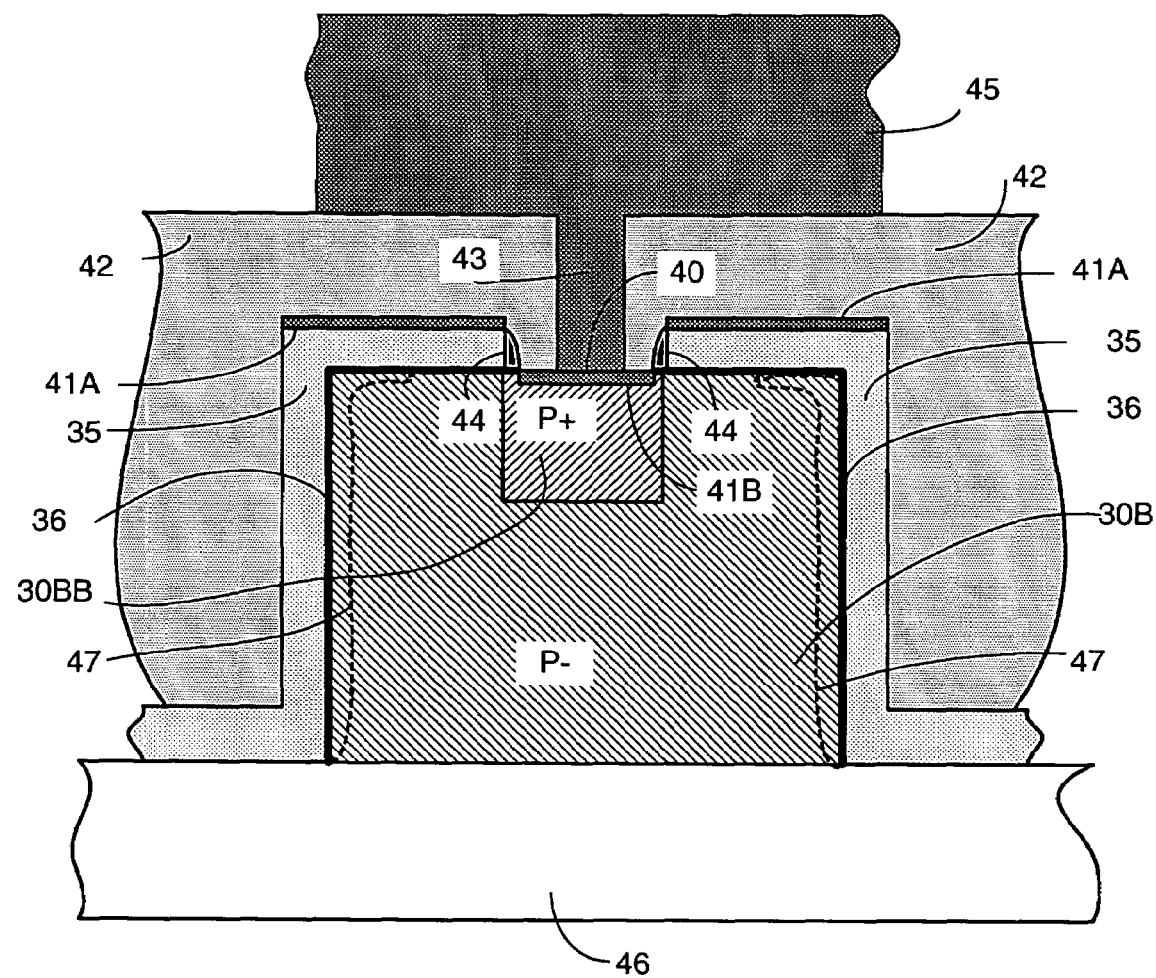
FIG. 6E shows a cross sectional view of BB, as shown in FIG. 6D.

FIG. 6E shows a cross sectional view as identified in FIG. 6D. Referenced items refer to like items with the same reference numerals. Insulating layer 42 is deposited, covering all of the shapes described previously. A via 43 is formed in insulating layer 42. A conductor 45 is deposited on a top surface of insulating layer 42, providing an electrically conducting path to a voltage supply or to another electrical circuit on the semiconductor chip. Conductor 45 also fills via 43, providing an electrical contact to doped semiconductor area 30B through silicide 41B at contact 40. FIG. 6E shows a P+ 30BB doped semiconductor area (for an NFET), which is optional, since silicide layer 41B would make an acceptable electrical contact between metal 45 and doped semiconductor area 30B without the additional doping shown as doped semiconductor area 30BB. Note that higher current contacts on the semiconductor chip typically would have a P+ doped semiconductor area (for contacts to P− semiconductor regions, N+ for contact to N− semiconductor regions) for a lower resistance contact. A body contact conducts very little current, so doped semiconductor area 30BB is optional for a body contact. A voltage (e.g., a supply voltage, ground, or coupling to another circuit) existing on metal 45 is coupled through via 43, through silicide layer 41B, and into semiconductor area 30B (and through doped semiconductor area 30BB, if it is implemented), providing that voltage to the body 47 of the FinFETs. Note that the dotted lines 47 indicate where carriers flow when a voltage supplied to polysilicon shape 35 turns the FinFET on. As shown in FIG. 6E, carriers would flow orthogonal to the page.

Figure 6F:
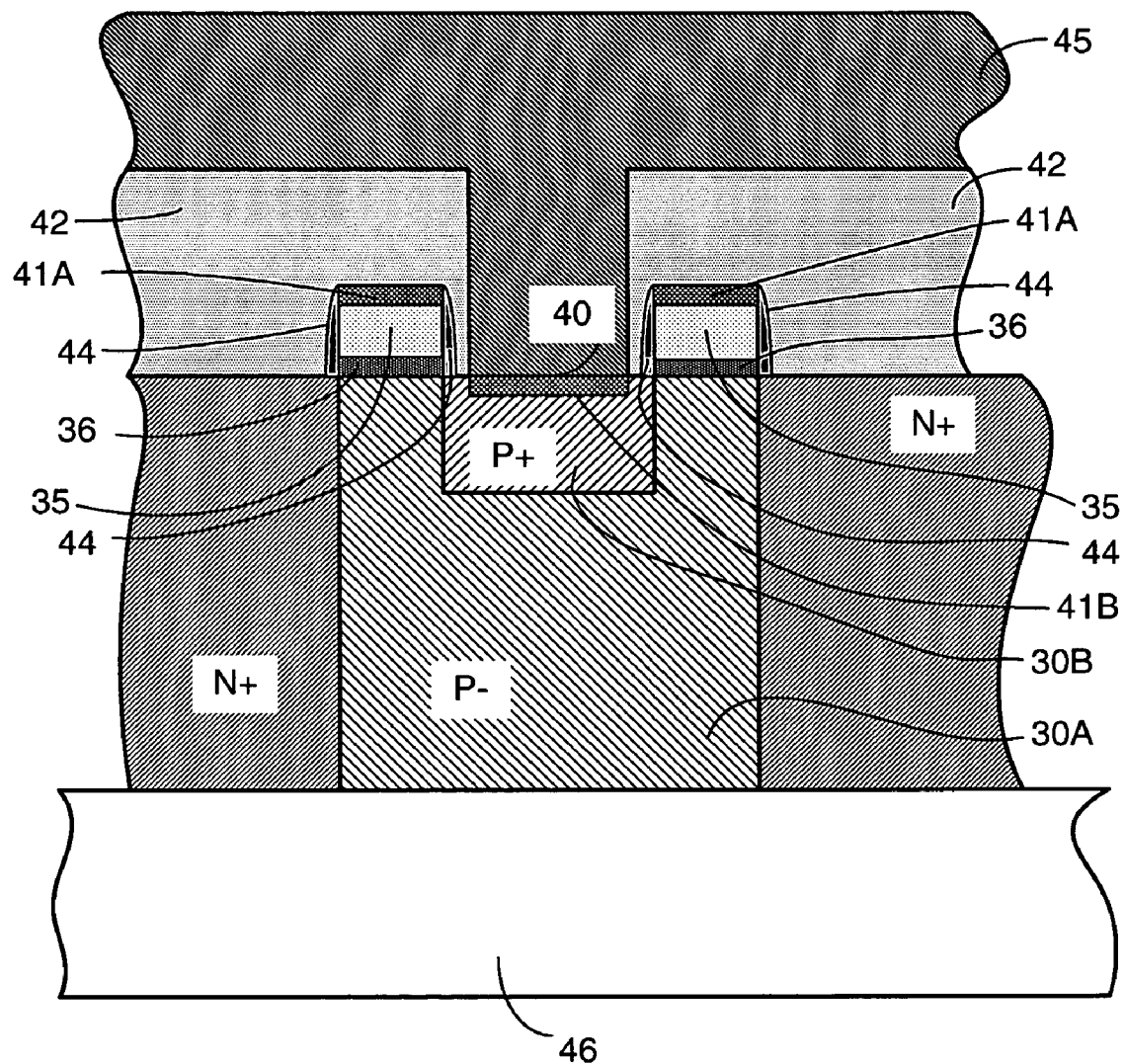
FIG. 6F shows a cross sectional view of CC, as shown in FIG. 6D.

FIG. 6F shows a cross sectional view of wide fin portion 31 at CC. No FET devices exist in this cross section. Polysilicon shapes 35 in FIG. 6F are merely the topmost and bottommost sections of polysilicon shapes 35 in polysilicon polygon shape 32. A N+/P− diode exists (when this structure, as shown in FIG. 6E, is used to support a body contact on an NFET) on a border between N+ and P− regions, as will be understood by those skilled in the art; therefore, a designer must provide suitable voltages to each side of the N+/P− junction. For example, if the P− region is coupled to a voltage greater than a diode drop (approximately 0.7 volts for a silicon diode) positive with respect to the N+ region, the diode would forward bias and conduct.

Those skilled in the art will appreciate that FinFET body contact structure 21 (FIG. 6D) provides a relatively low impedance path from contact 40 to bodies of FinFETs 50A, 50B because the relatively large volume of semiconductor (P− for NFET FinFETs) under polysilicon polygon shape 32 and center area 30B provide a wide path for current to flow to any point of the bodies of FinFETs 50A, 50B. Typically, even conventional planar FETs only have body contacts couple to one or both ends of a FET, causing portions of bodies of such FETs to have very high resistance between those portions and the contacts. Embodiments of the present invention provide an electrical path wider than a channel length of FinFETs 50A, 50B for substantially all of a distance from contact 40 to all points of the bodies of FinFETs 50A, 50B.

Figure 8:
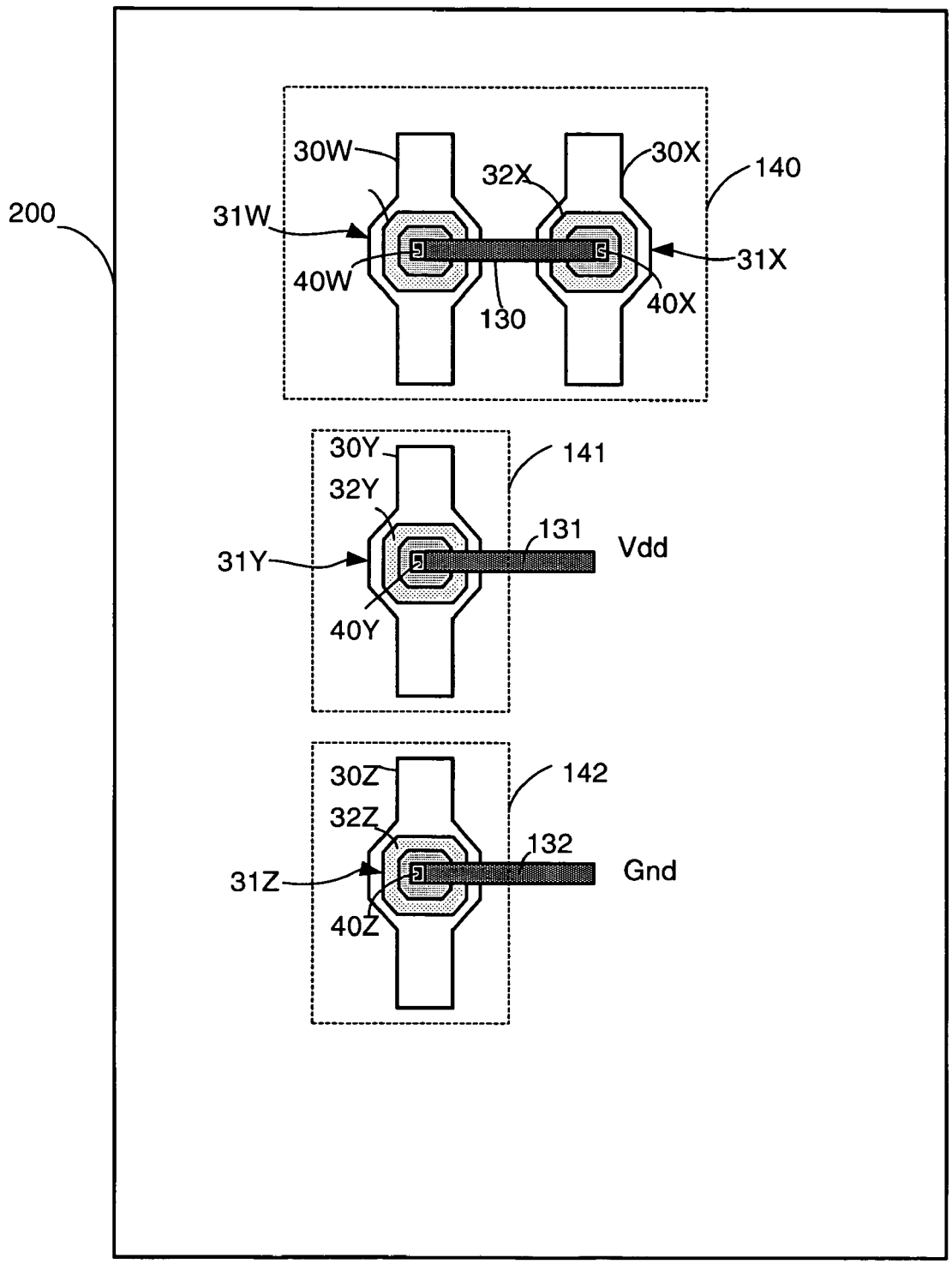
FIG. 8 shows a semiconductor chip having several circuit portions having FinFETs with body contact structures as taught by the invention.

FIG. 8 shows a semiconductor chip 200 which has a plurality of FinFET circuits formed thereon. Semiconductor chip 200 advantageously comprises a semiconductor substrate (not shown), such as silicon. An insulator (e.g., insulator 46 of FIG. 6E) such as silicon dioxide is deposited or grown on a top surface of the semiconductor substrate. Circuit portions 140, 141 and 142 show one or more semiconductor fins 30 that are as taught earlier. For ease in referencing specific items, a letter is appended after the reference numeral of semiconductor fins 30, polysilicon polygon shapes 32, and contacts 40. For simplicity, only the semiconductor fins 30, the wide fin portions 31, the polysilicon polynomial shapes 32, and the contacts 40 are shown in the figures, which are intended only to show that conducting materials such as metal can be used to couple FinFET bodies to other circuit elements or to voltage supplies. The FinFETs, for simplicity, are not shown, but are formed on first and second sides of wide fin portions 31 as shown, e.g., in FIG. 6D.

Circuit portion 140 shows two semiconductor fins, 30W, 30X. Wide fin portions 31W, 31X each have two FinFETs (not shown) as taught earlier. Polysilicon polygon shapes 32W and 32X each have a center area in which contact 40W and 40X are made, respectively. In other words, the body contact structure is substantially the same for the FinFETs on semiconductor fins 30W and 30X.

FinFETs on semiconductor fins 30W and 30X could be the receiving FETs on a differential amplifier. Advantageously, body voltages of receiving FETs on a differential amplifier should be the same voltage. Conductor 130, advantageously metal, such as copper or aluminum is shown coupled to contact 40W and 40X, ensuring that the FinFETs on semiconductor fins 30W and 30X share the same body voltage. Note that a portion of contacts 40W and 40X are shown for identification in the drawing; typically, contacts 40W, 40X would be totally covered by conductor 130.

Circuit portion 141 shows a semiconductor fin 30Y having a wide fin portion 31 Y, a top surface of wide fin portion 31Y having polysilicon polygon shape 32Y, and a center area containing contact 40Y. Conductor 131 couples contact 40Y to Vdd, which is typically a voltage supply positive with respect to ground, but could be negative with respect to ground. FinFET PFETs on the wide fin portion of semiconductor fin 30Y would typically have a Vdd coupled to the bodies of the FinFET PFETs. Note that a portion of contact 40Y is shown for identification in the drawing; typically, contact 40Y would be totally covered by conductor 131.

Circuit portion 142 shows a semiconductor fin 30Z having a wide fin portion 31Z, a top surface of wide fin portion 31Z having polysilicon polygon shape 32Z, and a center area containing contact 40Z. Conductor 132 couples contact 40Z to Gnd. Typically NFETs have their bodies coupled to ground. Note that a portion of contact 40Z is shown for identification in the drawing; typically, contact 40Z would be totally covered by conductor 132.

Figure 7A:
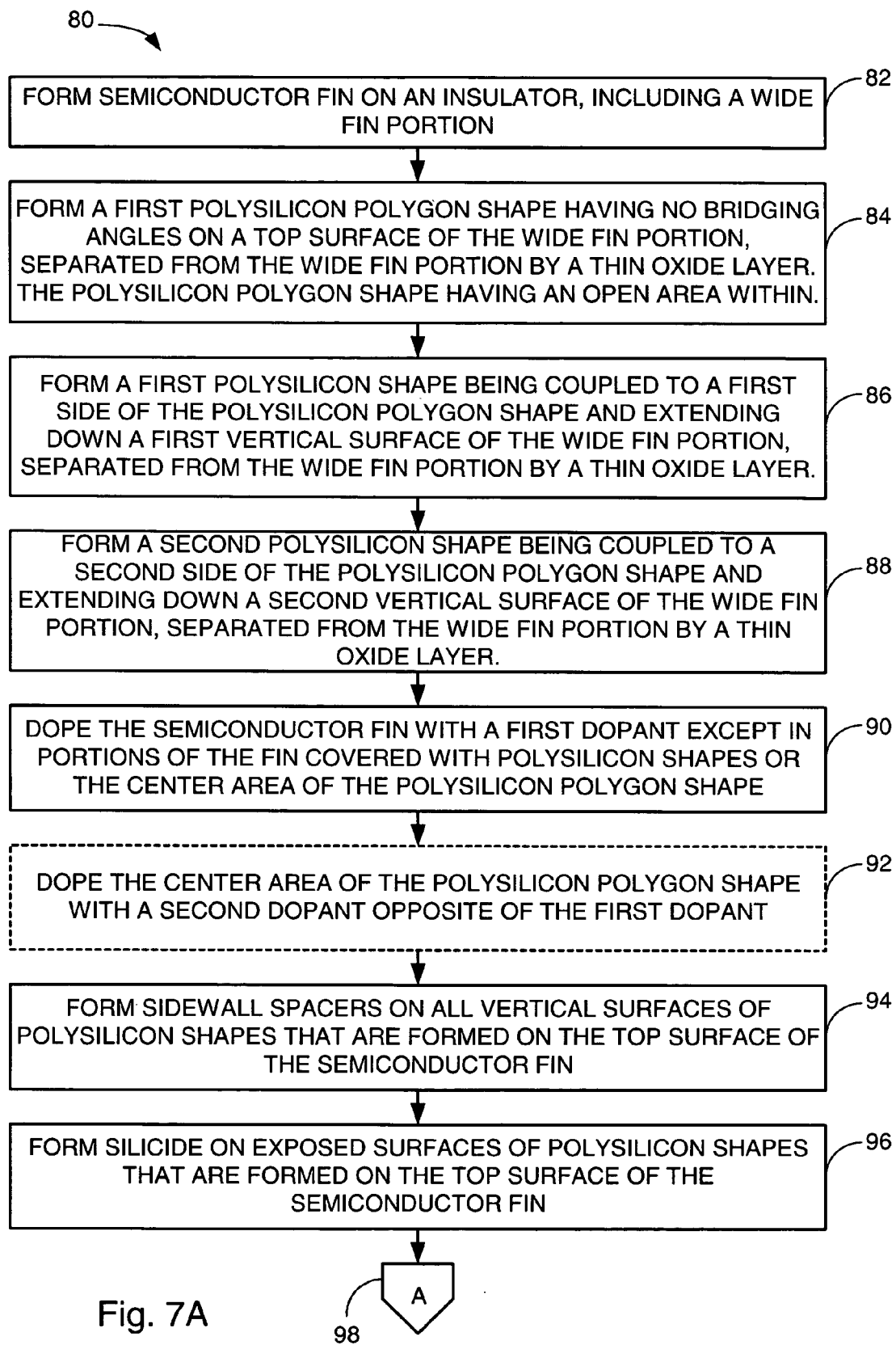
FIGS. 7A, 7B together illustrate a flowchart of a method to create a FinFET body contact.
Figure 7B:
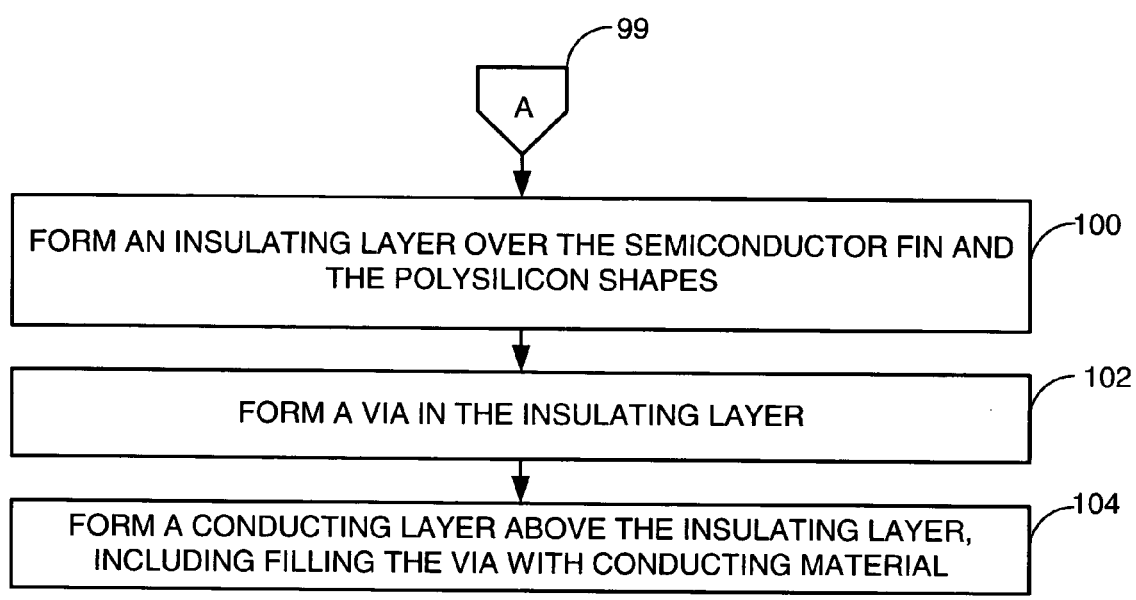

Turning now to FIGS. 7A, 7B, a flowchart illustrates method 80 showing steps taken to create a body contact according to an embodiment of the present invention.

Method 80 begins at step 82; a semiconductor fin is formed on an insulator, including a wide fin portion. Advantageously, the insulator is on a top surface of a semiconductor chip. For example, a silicon dioxide layer could be grown on the semiconductor chip to form the insulator. An exemplary wide fin portion of the semiconductor fin was illustrated in FIG. 6A. The wide fin portion can be any suitable shape capable of having a polysilicon polygon shape to be described shortly formed on a top surface of the wide fin portion. The wide fin portion 81 shown in FIG. 6A is drawn as a regular octagon; however, rectangles, hexagons, and squares are, for examples, also suitable.

Step 84 of method 80 forms a polysilicon polygon shape having no bridging vertices on a top surface of the wide fin portion. The polysilicon polygon shape has an open area in its center, so the polysilicon polygon shape is roughly "donut" shaped. A thin oxide layer separates the polysilicon polygon shape from the semiconductor fin, preventing electrical short circuiting between the polysilicon polygon shape and the semiconductor fin. As explained earlier, all the convex angles on the polysilicon polygon shape must be obtuse enough to prevent a bridging vertex. All angles on the "inside" (i.e., the center area of polysilicon polygon shape 32) are concave angles, and are therefore not bridging vertices. As stated earlier, the polysilicon polygon shape 32 need not have the same number of angles defining the center area. For example, the convex angles of the polysilicon polygon shape may be 135 degrees (e.g., an octagon), but the concave angles of the polysilicon polygon shape defining the center area may be 90 degrees (e.g., a rectangle or square).

Step 86 forms a first polysilicon shape that is coupled to a first side of the polysilicon polygon shape. The first polysilicon shape may have a horizontal portion that is on the top surface of the wide fin area. The first polysilicon shape has a vertical portion that extends down a first vertical surface of the wide fin portion, separated from the wide fin portion by a layer of thin oxide. The horizontal portion and the vertical portion of the first polysilicon shape are similar to normal FinFET vertical and horizontal polysilicon shapes that form FinFET gates in a conventional FinFET process.

Step 88 forms a second polysilicon shape that is coupled to a second side of the polysilicon polygon shape, advantageously opposite from the first polysilicon shape. The second polysilicon shape may have a horizontal portion that is on the top surface of the wide fin area. The second polysilicon shape has a vertical portion that extends down a second vertical surface of the wide fin portion, separated from the wide fin portion by a layer of thin oxide. The horizontal portion and the vertical portion of the second polysilicon shape are similar to normal FinFET vertical and horizontal polysilicon shapes that form FinFET gates in a conventional FinFET process.

Step 90 dopes the semiconductor fin with a first dopant, except in portions of the fin covered with polysilicon shapes (i.e., the polysilicon polygon shape, the first polysilicon shape, and the second polysilicon shape), and also excepting the center area of the polysilicon polygon shape. A conventional blocking mask can be used to prevent the first dopant, used to suitably dope FinFET source and drain regions, from doping the wide fin area semiconductor in the center area of the polysilicon polygon shape. It will be understood by those skilled in the art that the polysilicon polygon shape must be large enough to accommodate the conventional blocking mask. Polysilicon shapes, as in conventional processes, block the first dopant from doping portions of the semiconductor material covered by the polysilicon shape. For NFET FinFETs, the first dopant is an N+ dopant, and the fin is of P− semiconductor material. For PFET FinFETs, the first dopant is a P+ dopant, and the fin is of N− semiconductor material.

Step 92 is an optional step that, if performed, lowers a series resistance in the body contact. The center area is doped with a second dopant that is of the opposite type of the first dopant. For an NFET FinFET, the body (original material in the semiconductor fin) is P−. For the NFET FinFET, P+ material can be doped into the wide fin in the center area of the polysilicon polygon shape. P+ material is a better conductor (i.e., less electrical resistance) than P−. However, very little current is required for a body contact, and electrical resistance is generally not a problem in a body contact.

Step 94 forms sidewall spacers on all vertical surfaces of polysilicon shapes that are formed on the top surface of the semiconductor fin. The vertical surfaces of the polysilicon polygon shape and the vertical surfaces of the first horizontal portions of the first polysilicon shape and the vertical surfaces of the second horizontal portions of the second polysilicon shape, therefore have sidewall spacers formed thereon.

Step 96 forms a silicide (e.g., titanium silicide) on exposed surfaces of polysilicon shapes that are formed on the top surface of the semiconductor fin (i.e., a top surface of the polysilicon polygon shape, a top surface of the first polysilicon horizontal shape, a top surface of the second polysilicon shape horizontal portion. Exposed semiconductor areas (i.e., exposed top surface areas on the semiconductor fin) are also silicided. As explained earlier, the sidewall spacers prevent silicide bridges from forming electrical short circuits between silicided polysilicon shapes and silicided semiconductor areas.

Connector 98 on FIG. 7A passes control to connector 99 on FIG. 7B.

Step 100 forms an insulating layer over the semiconductor fin and the polysilicon shapes. Advantageously, the insulating layer is formed of silicon dioxide or other suitable insulating material in the semiconductor process.

Step 102 forms a via in the insulating layer. The via is formed in the center area of the polysilicon polygon shape. In some semiconductor processes, the via is filled with a conductor prior to step 104; in other semiconductor processes a conducting layer as taught in step 104 fills the via and makes electrical coupling to the semiconductor area in the center of the polysilicon polygon shape. Note that the semiconductor area in the center of the polysilicon polygon shape has been silicided, so that an acceptable coupling is made. If the semiconductor area in the center of the polysilicon polygon shape had not been silicided, a Schottkey diode could be formed that would prevent an acceptable electrical coupling.

Step 104 forms a conducting layer above the insulating layer. Processing of the conducting layer creates signal, ground, and voltage supply interconnection on a semiconductor chip. The conducting layer fills the via, making an electrical coupling to the center area of the polysilicon polygon shape. The conducting layer couples the semiconductor area in the center of the polysilicon polygon shape to a voltage supply or another circuit. Since the semiconductor area in the center area of the polysilicon polygon shape is the body of FinFETs created by the vertical and horizontal portions of the first and second polysilicon shapes, the structure described is a body contact for those FinFETs, and the bodies of those FinFETs can be coupled to ground, a voltage supply, or another circuit on the semiconductor chip. Step 104 is the completion of method 80.

What is claimed is:

1. A FinFET body contact structure comprising:
    a semiconductor fin formed on an insulator further comprising a wide fin portion having a top surface and two or more vertical surfaces;
    a polysilicon polygon shape formed on the top surface of the wide fin portion, separated from the wide fin portion by a thin layer of oxide, the polysilicon polygon shape having a center area without polysilicon the polysilicon polygon shape having at least one convex angle;
    a first FinFET having a gate comprising a first polysilicon shape formed on a first vertical surface of the wide fin portion separated from the vertical surface of the wide fin portion by a layer of thin oxide, the first FinFET coupled to the polysilicon polygon shape;
    a second FinFET having a gate comprising a second polysilicon shape formed on a second vertical surface of the wide fin portion separated from the second vertical surface by a layer of thin oxide;

the center area being doped opposite to a doping of source and drain regions of the first FinFET and the second FinFET, the center area being a body of both the first FinFET and the second FinFET; and a contact in the center area suitable for coupling the center area to an electrical conductor.

2. The FinFET body contact structure of claim 1, further comprising a silicide formation on the top surface of the wide fin portion and a top surface of the polysilicon polygon shape.

3. The FinFET body contact structure of claim 2, further comprising a sidewall spacer on vertical surfaces of the polysilicon polygon shape.

4. The FinFET body contact structure of claim 3, the polysilicon polygon shape having no bridging vertex.

5. The FinFET body contact structure of claim 4, the center area of the polysilicon polygon shape having all concave angles.

6. The FinFET body contact structure of claim 4, the polysilicon polygon shape having each convex angle at least 135 degrees.

7. The FinFET body contact structure of claim 4, the polysilicon polygon shape having each convex angle at least 120 degrees.

8. The FinFET body contact structure of claim 4, the polysilicon polygon shape having each convex angle at least 90 degrees.

9. The FinFET body contact structure of claim 1, the first FinFET further comprising a horizontal portion comprising a polysilicon shape formed on the top surface of the wide fin portion, separated from the wide fin portion by a thin oxide.

10. The FinFET body contact structure of claim 1, the second FinFET further comprising a horizontal portion comprising a polysilicon shape formed on the top surface of the wide fin portion, separated from the wide fin portion by a thin oxide.

11. A method of creating a body contact structure capable of coupling a voltage to a body of a FinFET, comprising the steps of:

forming a semiconductor fin on an insulator, the fin having a wide fin portion having a top surface and two or more vertical surfaces;

forming a polysilicon polygon shape on the top surface of the wide fin portion, separated from the wide fin portion by a layer of thin oxide, the polysilicon polygon shape having a center area without polysilicon, the polysilicon polygon shape having at least one convex angle;

forming a first FinFET on a first vertical surface of the wide fin portion;

coupling a first polysilicon shape forming a gate of the first FinFET to the polysilicon polygon shape;

forming a second FinFET on a second vertical surface of the wide fin portion;

coupling a second polysilicon shape forming a gate of the second FinFET to the polysilicon polygon shape;

creating sidewall spacers on vertical surfaces of the polysilicon polygon shape;

forming a silicide on surface areas of the top surface of the wide fin portion not covered by polysilicon or sidewall spacers;

forming a silicide on a top surface of the polysilicon polygon shape doping the center area of the polysilicon polygon shape opposite to dopings of source and drain regions of the first FinFET and of the second FinFET, thereby configuring the center area to be a body region of the first FinFET and of the second FinFET; and forming a contact in the center area of the polysilicon polygon shape, thereby configuring the center area to be connected to a voltage source independent of the source and drain regions of the first FinFET and of the second FinFET.

12. The method of claim 11, forming the polysilicon polygon shape including the step of ensuring that no bridging vertex is created.

13. The method of claim 12, the step of forming the polysilicon polygon shape including the step of forming the polysilicon polygon shape large enough to accommodate a blocking mask suitable to prevent the center area from receiving dopant used to dope FinFET source and drain regions.

14. The method of claim 12, including the step of ensuring that all convex angles on the polysilicon polygon shape are obtuse enough to prevent creation of bridging vertices.

* * * * *